United States Patent [19]
Robbins

[11] Patent Number: 5,474,614
[45] Date of Patent: Dec. 12, 1995

[54] METHOD AND APPARATUS FOR RELEASING A SEMICONDUCTOR WAFER FROM AN ELECTROSTATIC CLAMP

[75] Inventor: Roger A. Robbins, Allen, Tex.

[73] Assignee: Texas Instruments Incorporated, Dallas, Tex.

[21] Appl. No.: 257,993

[22] Filed: Jun. 10, 1994

[51] Int. Cl.⁶ ............................ C23C 16/00; B25B 11/00; H01G 3/00; H01T 23/00
[52] U.S. Cl. ................................. 118/728; 361/234; 269/8
[58] Field of Search ............................ 118/728; 361/234; 269/8

[56] References Cited

U.S. PATENT DOCUMENTS 5,055,964  10/1991  Logan et al. ............................. 361/234
5,213,349  5/1993  Elliott ......................................... 269/8

OTHER PUBLICATIONS

Philip C. D. Hobbs, et al., "Reviewing Clean Corona Discharge, Laser–Produced Plasma Ionization Technologies," *Microcontamination*, Jun., 1991, pp. 19–26.

*Primary Examiner*—Olik Chaudhuri
*Assistant Examiner*—Brian K. Dutton
*Attorney, Agent, or Firm*—W. James Brady, III; Richard L. Donaldson

[57] ABSTRACT

A method and apparatus is provided for effectively releasing a semiconductor wafer (36) from a deactivated electrostatic clamp (20) by diffusing a neutralizing gas into the space between the clamping surface of the electrostatic clamp and the surface of the wafer, generating an ionizing voltage with an alternating polarity, and applying the alternating polarity ionizing voltage to the diffusing gas to neutralize the residual electrostatic charges remaining on the surfaces of the clamp (20) and the wafer (36).

16 Claims, 2 Drawing Sheets

METHOD AND APPARATUS FOR RELEASING A SEMICONDUCTOR WAFER FROM AN ELECTROSTATIC CLAMP

TECHNICAL FIELD OF THE INVENTION

This invention relates generally to the process of fabricating semiconductor integrated circuits, and more particularly, to a method and apparatus for releasing a semiconductor wafer from an electrostatic clamp.

BACKGROUND OF THE INVENTION

Semiconductor integrated circuits (ICs) are commonly fabricated by etching and depositing materials to form circuit patterns in layers on a silicon wafer. In a conventional fabrication process, the ICs are formed from silicon wafers processed in a high vacuum, plasma reaction chamber. During such a process, an electrostatic clamp is used to hold the wafer in position in the chamber. FIGS. 1a and 1b illustrate a top view and side view, respectively, of an existing electrostatic clamp that can be used to hold a wafer for etching/vapor deposition processing in a plasma reaction chamber.

Referring to FIG. 1a, electrostatic clamp 10 includes a circular "chuck" 11 having two wafer attachment surface segments 12a and 12b. Surface segments 12a and 12b are constructed from an electrical insulating material. During the plasma reaction process, a wafer is attached to electrostatic clamp 10 which is positioned in the plasma region of the reaction chamber (not explicitly shown).

Referring to FIG. 1b, which is a side view of the electrostatic clamp shown in FIG. 1a, high voltage electrodes 16a and 16b are buried, respectively, in insulated surface segments 12a and 12b. Each electrode 16a and 16b is connected to a respective positive and negative output pole of high voltage DC power supply 14. A silicon wafer 18 to be processed in the reaction chamber is placed against the attaching surface 12 of electrostatic clamp 10. In an automated fabrication process, a robot arm (not explicitly shown) can be used to place the wafer against the surface of the clamp and also retrieve the wafer after the process is completed. Alternatively, the wafer can be manually placed on, or retrieved from, surface 12 of the clamp.

To operate electrostatic clamp 10, high voltage DC power supply 14 is activated. For the configuration depicted in FIG. 1b, a positive voltage potential is applied to insulated surface segment 12a, and a negative voltage is applied to insulated surface segment 12b. Consequently, an electrostatic field is generated on surface segments 12a and 12b, which induces a distribution of electrical charges on the opposing surface segments of silicon wafer 18 (an electrical conductor). Simplistically, the wafer surface region nearest the positively charged surface segment 12a becomes negatively charged, and the wafer surface region nearest the negatively charged surface segment 12b becomes positively charged. These localized regions of opposite polarities, which are generated between the surface segments 12 and wafer 18, create an attractive force that holds the wafer to the surface of the clamp. Subsequently, after the etching/deposition process is completed, DC power supply 14 is turned off and the wafer is retrieved from the surface of the electrostatic clamp.

A major problem encountered with existing electrostatic clamps is that, for a significant duration after the "clamping" voltage is turned off, a substantial electrostatic charge remains on the opposing surfaces of the wafer and the clamp. These residual charges create an inherent, but undesirable, clamping force that is commonly referred to as "after-cling". This after-cling, or residual attractive force, continues to hold the wafer to the clamp after the clamp is turned off. Consequently, a significant number of these "stuck" wafers can be damaged as they are removed from the clamp unless the process is slowed enough to compensate for this after-cling problem.

In a different arrangement from that illustrated by FIG. 1b, wafer 18 and clamp 10 can be inverted in the reaction chamber. In other words, the attaching surface of clamp 10 is oriented downwards in FIG. 1b or towards the bottom of the chamber. Consequently, after the etching/deposition process is completed and the electrostatic clamp is turned off, the "after-cling" forces hold the wafer to the clamp but in an inverted position. Therefore, these "stuck" inverted wafers must be retrieved from the clamp very cautiously to keep them from dropping to the floor of the chamber. This problem complicates the wafer retrieval process and increases the overall IC fabrication time.

One technique that can be used to dislodge a "stuck" wafer from an electrostatic clamp is to lower the DC "clamping" voltage so that the wafer is held only lightly by the clamp. The resulting after-cling forces may then be overcome relatively easily by using mechanical lift pins to remove the wafer from the clamp. However, this technique is undesirable for a number of reasons. For example, there is a danger of suddenly dislodging the wafer from the clamp and losing it during such handling. Furthermore, mechanical lift pins affect the uniformity of the electrical field generated during the reaction process which, in turn, degrades the reliability of the IC fabrication process. Also, for the most part, it is desirable to control the temperature of the wafer during the reaction process. Therefore, a pressurized gas (e.g., helium), which has good heat transmission properties, is dispersed in the region between the wafer and the surface of the clamp. The helium gas functions primarily to transfer heat from the wafer to the clamp and thereby cool the wafer during the reaction process. However, to cool the wafer most effectively, the wafer is held tightly to the surface of the clamp so that the pressurized-gas medium can more efficiently transfer heat from the wafer to the surface of the clamp. So, in practice, the clamping force that is typically used is relatively high, which produces a high after-cling force on the wafer.

SUMMARY OF THE INVENTION

Accordingly, a need exists in the integrated circuit manufacturing industry for an effective technique to neutralize the residual electrostatic charges that exist between an electrostatic clamp and a semiconductor wafer and thereby release the wafer from the clamp. In accordance with the present invention, a method and apparatus is provided for effectively releasing a semiconductor wafer from a deactivated electrostatic clamp by diffusing a neutralizing gas into the space between the clamping surface of the electrostatic clamp and the surface of the wafer, generating an ionizing voltage with an alternating polarity, and applying the alternating polarity ionizing voltage to the diffusing gas to neutralize the residual electrostatic charges remaining on the surfaces of the clamp and the wafer.

An important technical advantage of the present invention is that by neutralizing the after-cling force between the clamp and the wafer, the wafer may then be removed more rapidly from the clamp, which decreases the overall processing time and costs. Another important technical advantage of the present invention is that by removing the unevenly distributed after-cling force between the clamp and the wafer, the wafer is less likely to be dropped or otherwise damaged while it is being retrieved from the clamp.

BRIEF DESCRIPTION OF THE DRAWINGS

For a more complete understanding of the present invention, and the advantages thereof, reference is now made to the following descriptions taken in conjunction with the accompanying drawings, in which:

FIG. 1b illustrates a side view of the electrostatic clamp shown in FIG. 1a.

DETAILED DESCRIPTION OF THE INVENTION

The preferred embodiment of the present invention and its advantages are best understood by referring to FIGS. 1a–3 of the drawings, like numerals being used for like and corresponding parts of the various drawings.

Figure 1A:
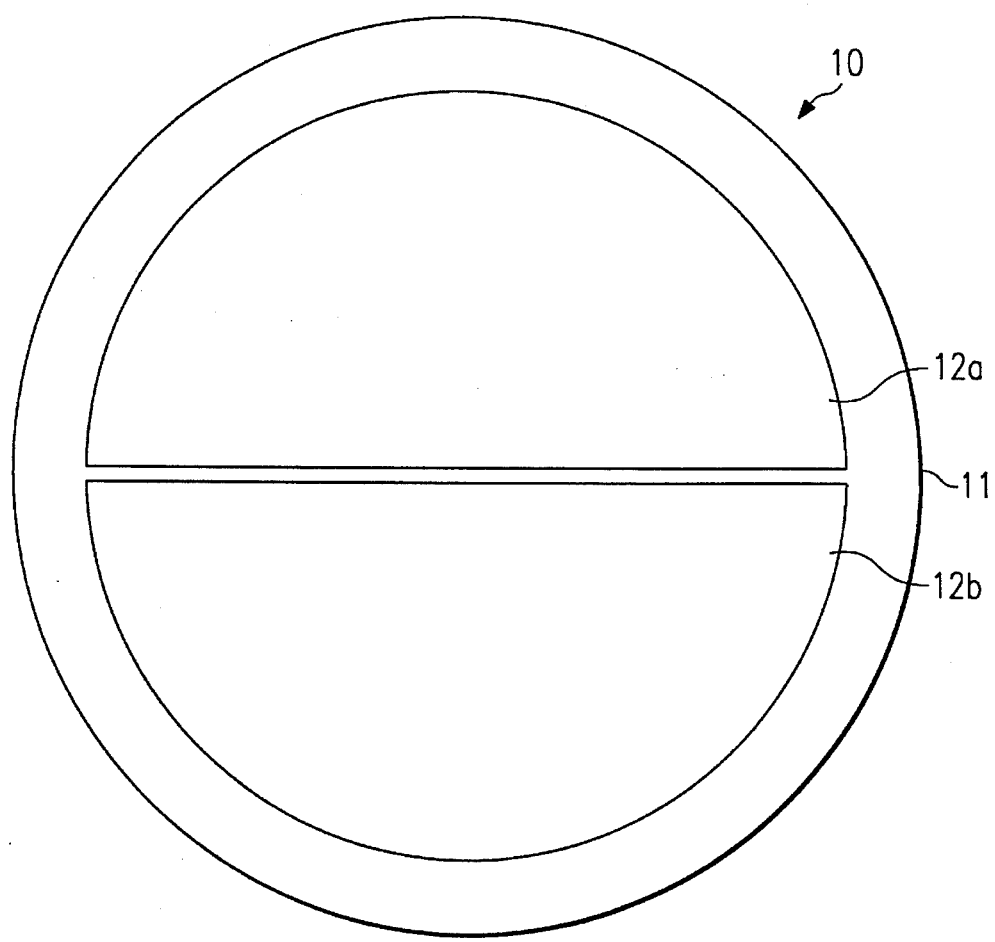
FIG. 1a illustrates a top view of an existing electrostatic clamp.
Figure 1B:
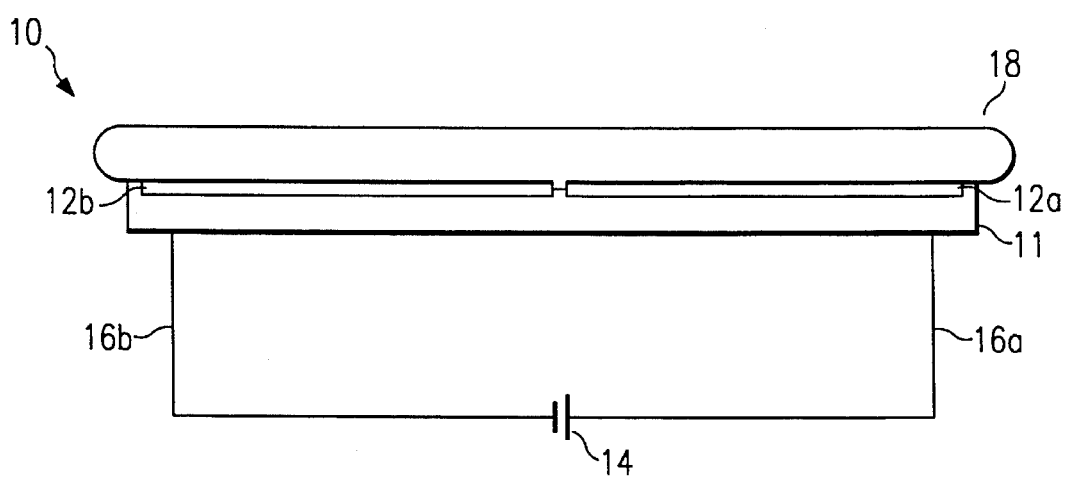
Figure 2:
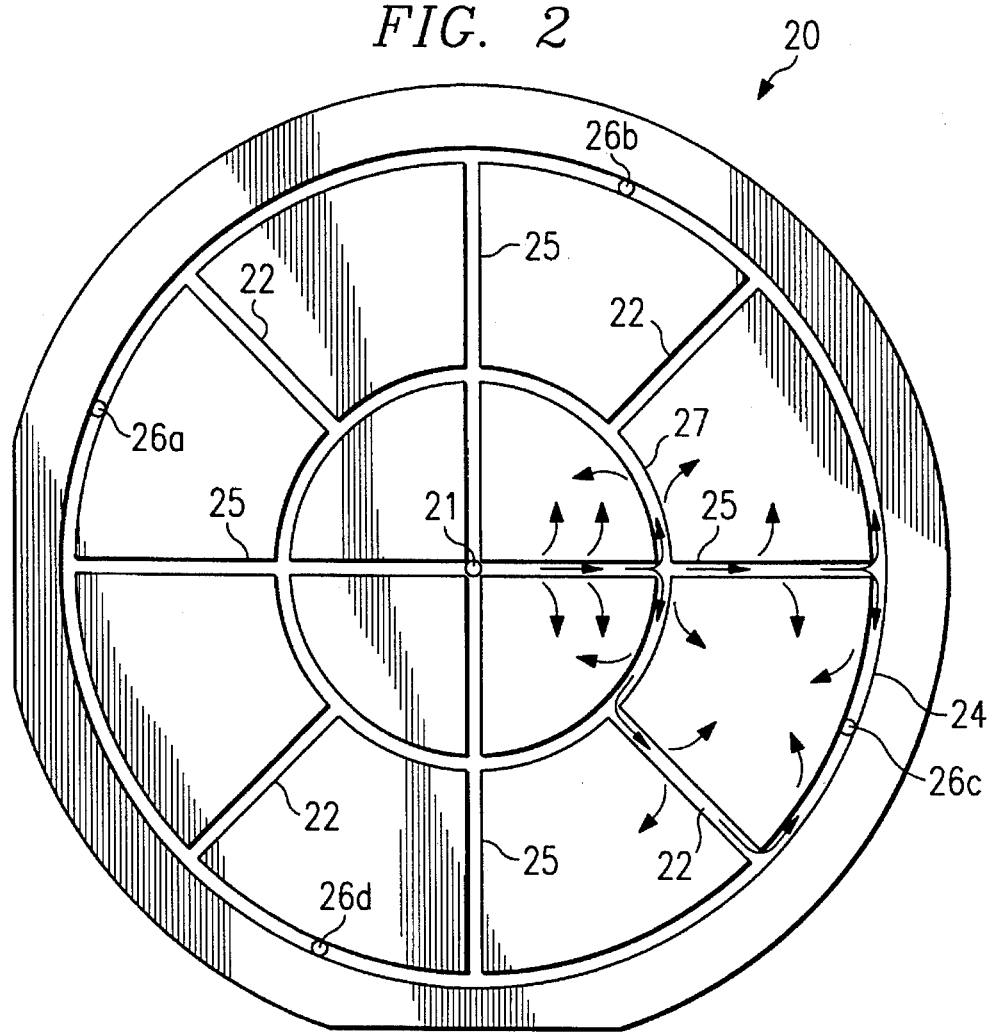
FIG. 2 illustrates a top view of a preferred embodiment of an electrostatic clamp according to the teachings of the present invention.

FIG. 2 illustrates a top view of a preferred embodiment of an electrostatic clamp according to the teachings of the present invention. Referring to FIG. 2, electrostatic clamp 20 may include an upper surface that functions as a "clamping" surface. The clamping surface of electrostatic clamp 20 may cover the complete top surface shown in FIG. 2 and is constructed from an electrical insulating material such as, for example, aluminum oxide. A plurality of circular and radial grooves defined as gas flow channels are machined or otherwise formed in the clamping surface of electrostatic clamp 20. These channels function to diffuse a pressurized gas between the surface of the clamp and a wafer that is being held by the clamp. For this embodiment, two circular gas flow channels 24 and 27, and eight radial gas flow channels 22 and 25 are shown for illustrative purposes only, but the invention is not intended to be limited to a specific number of such channels. Preferably, circular gas flow channel 24 can be formed substantially near the periphery of clamp 20, and circular gas flow channel 27 can be formed approximately midway between channel 24 and the center point of clamp 20. Four radial gas flow channels 25 can be formed to conduct pressurized gas outward from the innermost portions of clamp 20 to circular gas flow channel 24. Four additional radial gas flow channels 22 can be formed to conduct pressurized gas from circular gas flow channel 27 to circular gas flow channel 24. A pressurized-gas input port 21 and four gas output ports 26a–d can be drilled, machined or otherwise formed completely through clamp 20. Gas input port 21 can be connected by a series of valves and tubing to one of a plurality of sources of pressurized gas (not shown). Gas output ports 26a–d can be connected by a series of valves and tubing to an appropriate exhaust or gas recapture system (not shown). The output valves may be used to control the pressure of the escaping gas to prevent any back pressure from inadvertently ejecting the wafer from the clamp.

Figure 3:
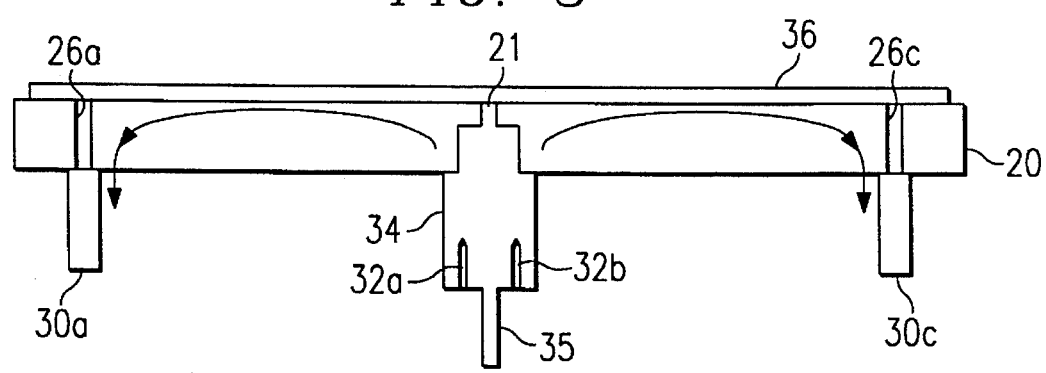
FIG. 3 illustrates a side view of the electrostatic clamp shown in FIG. 2.

FIG. 3 illustrates a side view of the electrostatic clamp shown in FIG. 2. Output gas ports 26 can be connected to their respective exhaust lines (not shown) via exhaust couplings 30. Although only two exhaust couplings 30a and 30c are shown in FIG. 3, it should be understood that at least two additional exhaust couplings 30b and 30d can be connected to respective output gas ports 26b and 26d of FIG. 2. However, it should be evident from the description that follows that it is unnecessary to provide a specific number of gas flow channels, input ports, and output ports formed in clamp 20 in order to practice the present invention. Input gas port 21 can be formed as an integral portion of cavity 34. Alternatively, cavity 34 may be formed as a separate structure and attached to the bottom surface of clamp 20. The inner surface of cavity 34 is constructed of an electrical insulating material; preferably, with Teflon. A pressurized gas can be introduced into cavity 34 through input gas coupling 35. Input coupling 35 may be selectively connected to one of a plurality of pressurized-gas sources via a series of valves and tubing. High voltage electrodes 32a and 32b can be disposed in cavity 34. Each electrode 32a and 32b is connected to a separate output pole of a "pulsed" DC power supply (not shown). In a preferred embodiment of the invention, a "Pulseflow" power supply manufactured by Static Control Services, Inc. may be used to provide a pulsed, DC ionization voltage to electrodes 32a and 32b. A semiconductor wafer 36, which is to be held by electrostatic clamp 20 during the reaction process, is disposed against the clamping surface of the clamp.

One pressurized-gas source can be selectively coupled to cavity 34 (using the above-described series of input valves and tubing) to provide helium gas, for example, which is used for its good heat transference properties to cool wafer 36. A second pressurized-gas source can also be selectively coupled to cavity 34. This second source can provide helium gas, which is used for its relatively good ionization properties. As described below, the present invention encompasses the use of an ionizing gas to neutralize the residual charges on the surfaces of the clamp and wafer and thereby diminish the after-cling forces. Consequently, although helium gas may be used as a neutralizing gas in a preferred embodiment, the present invention is not intended to be limited to a particular type of neutralizing gas, and any gas having appropriate ionization properties may be substituted for helium.

Electrostatic clamp 20 may be activated by applying a constant DC voltage to a pair of electrodes (not shown) buried in the insulated surface of the clamp. An electrostatic field can thereby be generated at the surface of clamp 20. The resulting electrostatic field in turn functions to create localized positive and negative charges on the respective, opposing surfaces of clamp 20 and wafer 36. These oppositely charged particles create an attractive force that holds the wafer to the surface of the clamp. In order to cool wafer 36 during the reaction process, a pressurized gas (e.g., helium) may be introduced to cavity 34 through a selection valve (not shown) and input coupling 35. The selected gas then flows generally outward in direction in the aforementioned gas flow channels from input port 21 to output ports 26a–d. The direction of gas flow is illustrated, in part, by the solid arrows depicted in FIGS. 2 and 3. These arrows also illustrate that the selected gas may be diffused throughout the region between the surface of clamp 20 and the opposing surface of wafer 36.

In operating electrostatic clamp 20 in accordance with the teachings of the present invention, once the reaction process is completed, the "clamping voltage" is turned off. Also, by selecting the appropriate input valve setting, the cooling gas medium (e.g., helium) being provided through coupling 35 is turned off. The second source that produces an ionizing gas is then selected (using the aforementioned series of valves), and the ionizing gas is introduced to cavity 34 through input coupling 35. The selected ionizing gas flows through input port 21, and gas flow channels 22, 24, 25 and 27, and is ultimately exhausted through output ports 26a–d. However, a significant portion of the ionizing gas flowing through the channels is diffused into the region between the opposing surfaces of clamp 20 and wafer 36.

The pulsed DC voltage supply (not shown) may be turned on. The output voltage from the pulsed DC supply, which is applied to electrodes 32a and 32b, alternates in polarity at the rate of approximately once every two seconds. Consequently, the ionizing gas in cavity 34 is "pulsed" to produce a succession of "packets" of ionized gas with alternating polarities. For example, a particular packet of ionized gas may contain positively charged ions, and the preceding and succeeding packets would then contain negatively charged ions. These ionized packets of alternating polarities diffuse into the region between the clamp and the wafer and thereby neutralize the residual charges remaining on the surfaces of the clamp and wafer. The flow of this "neutralizing" gas is maintained by the aforementioned series of output valves (not shown) coupled to the exhaust ports 30a–d. Thus, the rate of flow may be set so as to allow the ionized packets to reach the charged regions on the surfaces of the wafer and clamp before the ions in the packets become neutralized. Therefore, in accordance with the present invention, the after-cling force that exists between a semiconductor wafer and an electrostatic clamp may be reduced significantly (reduced effectively to zero), and the wafer may be retrieved more rapidly from the clamp, which decreases the overall wafer processing time and minimizes wafer damage.

Although the present invention and its advantages have been described in detail, it should be understood that various changes, substitutions and alterations can be made herein without departing from the spirit and scope of the invention as defined by the appended claims.

What is claimed is:

1. A method for releasing a semiconductor wafer from an electrostatic clamp, comprising the steps of:

diffusing a neutralizing gas into a region defined by a first surface of the electrostatic clamp and an opposing surface of the semiconductor wafer;

generating an ionizing voltage having a first polarity for a first duration and an opposite polarity for a second duration; and applying said ionizing voltage to said neutralizing gas.

2. The method of claim 1, wherein said first duration is equal to said second duration.

3. The method of claim 1, wherein at least one of said first and second durations comprises a random duration.

4. The method of claim 1, wherein said neutralizing gas comprises helium gas.

5. A method for releasing a semiconductor wafer from an electrostatic clamp; comprising the steps of:

generating a plurality of successive ionized gas packets;

alternating a polarity of said ionized gas packets at a rate to generate alternating polarity hackers of ionized gas; and directing said alternating polarity packets of ionized gas into a region defined by a clamping surface of said electrostatic clamp and an opposing surface of said semiconductor wafer.

6. The method of claim 5, wherein said rate comprises a random rate.

7. The method of claim 5, wherein said generating and alternating steps further comprise the steps of:

producing a stream of neutralizing gas;

applying an ionizing voltage to said stream of neutralizing gas; and alternating a polarity of said ionizing voltage at said rate.

8. The method of claim 5, wherein a portion of said region includes a plurality of residual electrostatic charges, said plurality of residual electrostatic charges being neutralized by said steps of applying an ionizing voltage and alternating a polarity of said ionizing voltage.

9. An electrostatic clamp, comprising:

a first surface and a second surface, said first surface being substantially flat and comprising a first electrical insulating material, said second surface being opposite said first surface;

a gas input port formed through said electrostatic clamp at a center of said first and second surfaces, said gas input port operable to flow a neutralizing gas in a direction from said second surface to said first surface;

a plurality of gas output ports, each port of said plurality of gas output ports formed through said first and second surfaces proximate a periphery of each of said first and second surfaces and operable to flow said neutralizing gas in said direction;

a cavity, said cavity including an input portion and an output portion, said output portion coupled to said gas input port, an inner surface of said cavity comprising a second insulating material, said cavity further including a plurality of electrodes;

a voltage generator coupled to said plurality of electrodes and operable to generate an alternating polarity voltage at a rate; and a neutralizing gas supply coupled to said input portion of said cavity and operable to supply said neutralizing gas, such that said neutralizing gas is ionized responsive to said alternating polarity voltage.

10. The electrostatic clamp of claim 9, wherein said clamp further comprises a plurality of gas flow channels formed in said first surface.

11. The electrostatic clamp of claim 9, wherein said clamp further comprises at least a first radial gas flow channel and second radial gas flow channel formed in said first surface and at least a circular gas flow channel formed in said first surface proximate said periphery of said first surface, said at least first and second radial gas flow channels coupled to said at least circular gas flow channel, said gas input port coupled to said at least first and second radial gas flow channels, and said plurality of gas output ports coupled to said at least circular gas flow channel.

12. The electrostatic clamp of claim 9, wherein said clamp further comprises a plurality of radial gas flow channels and a plurality of circular gas flow channels formed in said first surface, said channels operable to flow said neutralizing gas in a direction from said gas input port to said plurality of gas output ports.

13. The electrostatic clamp of claim 9, wherein said neutralizing gas comprises helium gas.

14. The electrostatic clamp of claim 9, wherein said duration comprises a random duration.

15. An apparatus for use in neutralizing a plurality of residual electrostatic charges on a clamping surface of an electrostatic clamp to facilitate the release of a semiconductor wafer, said apparatus comprising:

a gas supply operable to produce a neutralizing gas;

at least one gas flow channel formed in said clamping surface, an input of said at least one gas flow channel coupled to an output connection of said gas supply, said at least one gas flow channel operable to diffuse said neutralizing gas into a region between said clamping surface and a clamped surface of said wafer, said region including said plurality of residual electrostatic charges; and a DC voltage generator coupled to said input of said at least one gas flow channel and operable to apply a DC ionizing voltage to said neutralizing gas, said DC voltage generator further operable to reverse the polarity of said DC ionizing voltage and said neutralizing gas cyclically for a duration so as to neutralize the plurality of residual electrostatic charges.

16. The apparatus of claim 15, wherein said apparatus further comprises a plurality of gas flow channels formed in said clamping surface.

* * * * *